(12) United States Patent
Lee et al.

(10) Patent No.: US 10,153,458 B2
(45) Date of Patent: Dec. 11, 2018

(54) ORGANIC LIGHT EMITTING DIODE

(71) Applicant: Corning Precision Materials Co., Ltd., Chungcheongnam-do (KR)

(72) Inventors: Joo Young Lee, Chungcheongnam-do (KR); Yoon Young Kwon, Chungcheongnam-do (KR); Dong Hyun Kim, Chungcheongnam-do (KR); Seo Hyun Kim, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 19 days.

(21) Appl. No.: 15/539,892

(22) PCT Filed: Dec. 18, 2015

(86) PCT No.: PCT/KR2015/013906
§ 371 (c)(1),
(2) Date: Jun. 26, 2017

(87) PCT Pub. No.: WO2016/105029
PCT Pub. Date: Jun. 30, 2016

(65) Prior Publication Data
US 2017/0338443 A1 Nov. 23, 2017

(30) Foreign Application Priority Data
Dec. 24, 2014 (KR) .......................... 10-2014-0188494

(51) Int. Cl.
*H01L 51/00* (2006.01)
*H01L 51/52* (2006.01)
(Continued)

(52) U.S. Cl.
CPC .... *H01L 51/5268* (2013.01); *H01L 31/02327* (2013.01); *H01L 51/50* (2013.01);
(Continued)

(58) Field of Classification Search
CPC ............. H01L 51/5268; H01L 51/5275; H01L 51/524; H01L 51/5203; H01L 51/5253;
(Continued)

(56) References Cited

U.S. PATENT DOCUMENTS

2006/0220509 A1* 10/2006 Ghosh .................... B82Y 20/00
313/110
2007/0257608 A1* 11/2007 Tyan ....................... C03C 17/38
313/506
(Continued)

FOREIGN PATENT DOCUMENTS

JP          2011233412 A      11/2011
KR         20100009527 A       1/2010
(Continued)

OTHER PUBLICATIONS

International Search Report for Application No. PCT/KR2015/013906 dated Apr. 15, 2016.

*Primary Examiner* — Shouxiang Hu
(74) *Attorney, Agent, or Firm* — Lerner, David, Littenberg, Krumholz & Mentlik, LLP

(57) ABSTRACT

The present invention relates to an organic light emitting diode, and more specifically, to an organic light emitting diode capable of significantly increasing light extraction efficiency through optimization of a corrugated structure, which is formed by being transferred from an inner light extraction layer, thereby enabling excellent light-emitting efficiency. To this end, provided in the present invention is the organic light emitting diode comprising: a first substrate; the inner light emitting layer formed on the first substrate; a first electrode formed on the inner light emitting layer; an organic light emitting layer formed on the first electrode; and a second electrode formed on the organic light emitting layer, wherein corrugation is formed on the surface of the inner light emitting layer, wherein the corrugation is sequen- (Continued)

tially transferred onto the first electrode, the organic light emitting layer, and the second electrode, and wherein the surface of the second electrode comprises the corrugated structure, wherein the corrugated structure comprises a plurality of convex portions and a plurality of concave portions, which are formed between the convex portions that are adjacent, and wherein the depth/pitch ratio with respect to the pitch between the convex portions that are adjacent and the depth of the concave portions is 0.1 to 7.

10 Claims, 3 Drawing Sheets

(51) Int. Cl.
H01L 31/0232 (2014.01)
H01L 51/50 (2006.01)
(52) U.S. Cl.
CPC .......... *H01L 51/52* (2013.01); *H01L 51/5203* (2013.01); *H01L 51/524* (2013.01); *H01L 51/5253* (2013.01); *H01L 51/5275* (2013.01)

(58) Field of Classification Search
CPC ......... H01L 51/52; H01L 51/50; H01L 33/22; H01L 31/02327
See application file for complete search history.

(56) References Cited

U.S. PATENT DOCUMENTS

2011/0156063 A1* 6/2011 Lin ................. H01L 27/322 257/88
2014/0027753 A1 1/2014 Yamana et al.
2017/0346042 A1* 11/2017 Lee .................. H01L 51/56

FOREIGN PATENT DOCUMENTS

| KR | 101093259 B1 | 12/2011 |
| KR | 20120053318 A | 5/2012 |
| KR | 20120054887 A | 5/2012 |
| WO | 2013001891 A1 | 1/2013 |

* cited by examiner

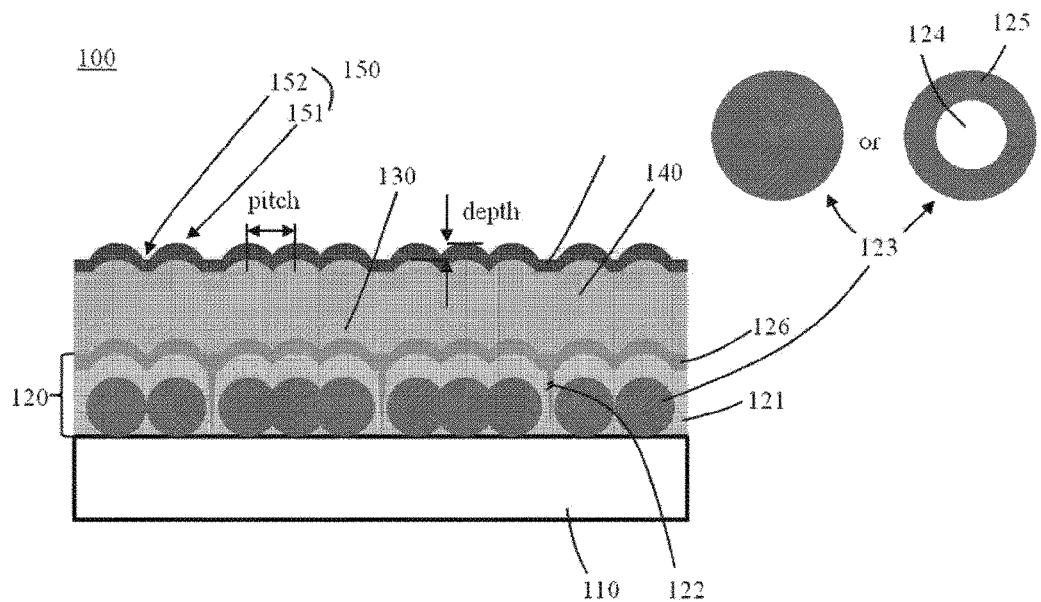

ORGANIC LIGHT EMITTING DIODE

CROSS-REFERENCE TO RELATED APPLICATION

This application is a national phase entry under 35 U.S.C. § 371 of International Application No. PCT/KR2015/013906, filed on Dec. 18, 2015, published in Korean, which claims priority to Korean Patent Application No. 10-2014-0188494, filed on Dec. 24, 2014, the disclosures of which are incorporated herein by reference.

TECHNICAL FIELD

The present disclosure relates to an organic light-emitting diode (OLED) device. More particularly, the present disclosure relates to an OLED device, in which a corrugated structure transferred from an internal light extraction layer is optimized to significantly increase light extraction efficiency, thereby realizing excellent luminance efficiency.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission of light, wide viewing angles, high resolution, natural color reproducibility, and rapid response times.

Recently, research has been actively undertaken into applying OLEDs to portable information devices, cameras, clocks, watches, office equipment, information display devices for vehicles or similar, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e., the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer functioning as an anode, and a lower-refractivity layer, such as a glass substrate. This may consequently lower light extraction efficiency, thereby lowering the overall luminous efficiency of the OLED device, which is problematic.

Described in more detail, only about 20% of light generated by an OLED is emitted from the OLED device and about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by the total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers, through which 80% of light that would otherwise be lost in the internal waveguide mode can be extracted, have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers.

However, the effect of improving light extraction efficiency using the internal light extraction layer is still insignificant with respect to the amount of outwardly emitted light. Therefore, active research into a method or technology for further improving light extraction efficiency is in demand.

RELATED ART DOCUMENT

Korean Patent No. 1093259 (Dec. 6, 2011)

DISCLOSURE

Technical Problem

Accordingly, the present disclosure has been made in consideration of the above-described problems occurring in the related art, and the present disclosure proposes an organic light-emitting diode (OLED) device, wherein a corrugated structure transferred from an internal light extraction layer is optimized to significantly increase light extraction efficiency, thereby realizing excellent luminance efficiency.

Technical Solution

According to an aspect of the present disclosure, an OLED device may include: a first substrate; an internal light extraction layer disposed on the first substrate; a first electrode disposed on the internal light extraction layer; an organic light-emitting layer disposed on the first electrode; and a second electrode formed on the organic light-emitting layer. The internal light extraction layer may have corrugations formed on a surface thereof. The second electrode may have a corrugated structure on a surface thereof, due to the corrugations of the internal light extraction layer sequentially transferred to the first electrode, the light-emitting layer, and the second electrode. The corrugated structure may have a plurality of convex portions and a plurality of concave portions alternating with the plurality of convex portions. An aspect ratio (depth/pitch) of a pitch between the adjacent convex portions to a depth of the concave portions may range from 0.1 to 7.

The internal light extraction layer may include: a matrix layer disposed on the first substrate, formed from metal oxide, a number of scattering particles dispersed in the matrix layer and formed from a material having a refractive index different from a refractive index of the metal oxide, and a filling layer disposed on a surface of the matrix layer to fill the cracks to reduce a surface roughness of the matrix layer. The corrugations formed in a surface of the filling layer may have shapes corresponding to shapes of the number of scattering particles and clusters of scattering particles among the number of scattering particles transferred thereto.

The matrix layer may have cracks formed therein.

The cracks may be formed between the number of scattering particles and between the clusters.

The surface roughness of the filling layer may be lower than the surface roughness of the matrix layer.

The matrix layer may be formed from one metal oxide or a combination of two or more metal oxides selected from a candidate group consisting of $SiO_2$, $TiO_2$, $ZrO_2$, $ZnO_2$, and $SnO_2$.

The number of scattering particles may be formed from one metal oxide or a combination of two or more metal oxides selected from a candidate group consisting of $SiO_2$, $TiO_2$, $ZnO_2$, and $SnO_2$.

At least portions of the number of scattering particles may respectively have a structure comprised of a hollow core and a shell surrounding the core.

The internal light extraction layer may further include a number of irregularly shaped voids disposed in the matrix layer.

Sizes of the number of irregularly shaped voids may range from 50 nm to 900 nm.

An area occupied by the number of irregularly shaped voids in the matrix layer may be 2.5% to 10.8% of an area of the matrix layer.

The OLED device may further include a second substrate disposed on the second electrode to face the first substrate to provide an encapsulation portion together with the first substrate.

Advantageous Effects

According to the present disclosure, the ability to reduce a waveguide mode and a surface plasmon mode that would otherwise cause a most significant loss to the efficiency of an OLED device can be maximized by optimizing a corrugated structure transferred from an inner light extraction layer and by controlling an aspect ratio, i.e. a ratio of a pitch between a plurality of convex portions of the corrugated structure to a depth of concave portions between the convex portions, to a predetermined range. It is thereby possible to significantly improve light extraction efficiency, thereby realizing superior luminance efficiency.

DESCRIPTION OF DRAWINGS

FIG. 1 is a schematic cross-sectional view illustrating an organic light-emitting diode (OLED) device according to an exemplary embodiment;

FIG. 2 is SEM images of corrugated structures of the OLED having various aspect ratios;

MODE FOR INVENTION

Figure 3:
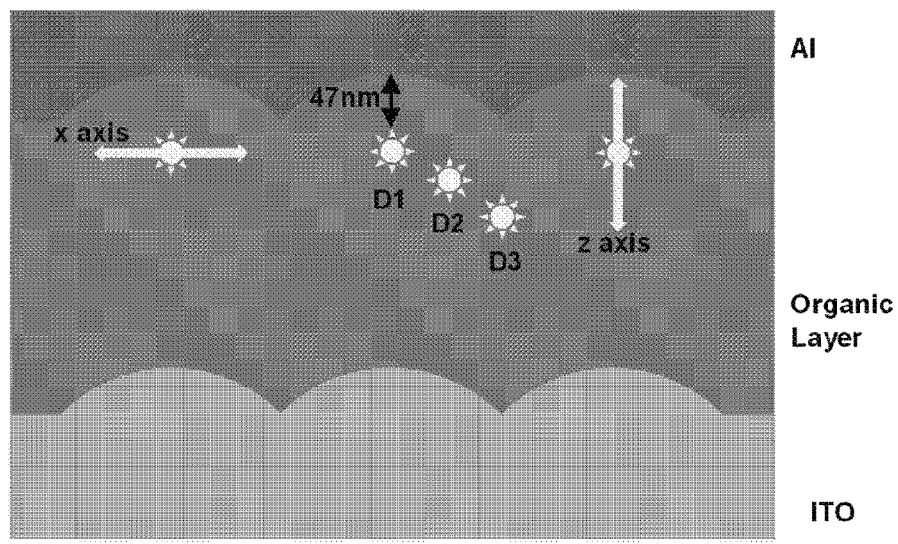
FIGS. 3 and 4 are reference views illustrating a simulation of the light luminance efficiency of the OLED device according to the exemplary embodiment.

Hereinafter, an organic light-emitting diode (OLED) device according to an exemplary embodiment will be described in detail with reference to the accompanying drawings.

In the following disclosure, detailed descriptions of known functions and components incorporated in the present disclosure will be omitted in the case in which the subject matter of the present disclosure may be rendered unclear by the inclusion thereof.

As illustrated in FIG. 1, an OLED device 100 according to an exemplary embodiment has a bottom emission structure. In addition, the OLED device 100 according to the exemplary embodiment may be used as a light source of a lighting device. An OLED of the OLED device 100 includes a first substrate 110, an internal light extraction layer 120, a first electrode 130, an organic light-emitting layer 140, and a second electrode 150.

The first substrate 110 is disposed on a front portion of the organic light-emitting layer 140, i.e., a portion through which light generated by the organic light-emitting layer 140 contacts the ambient air, to allow the light to exit while functioning to protect the internal light extraction layer 120, the first electrode 130, the organic light-emitting layer 140, and the second electrode 150 from the external environment. In this regard, to encapsulate the internal light extraction layer 120, the first electrode 130, the organic light-emitting layer 140, and the second electrode 150, the first substrate 110 is bonded to a second substrate (not shown) using, for example, a sealing material, such as epoxy, disposed along the edge thereof. The second substrate (not shown) is a rear substrate disposed on the second electrode 150 to face the first substrate 110. An inner space is defined by the first substrate 110 and the second rear substrate (not shown) facing each other, as well as the sealing material formed along the edges of the first substrate 110 and the second rear substrate. A portion of the inner space, except for portions occupied by the internal light extraction layer 120, the first electrode 130, the organic light-emitting layer 140, and the second electrode 150, may be filled with an inert gas or may be configured to have a vacuum atmosphere.

The first substrate 110 may be a transparent substrate formed from any transparent material having superior light transmittance and excellent mechanical properties. For example, the first substrate 110 may be formed from a polymeric material, such as a thermally or ultraviolet (UV) curable organic film. In addition, the first substrate 110 may be formed from chemically strengthened glass, such as soda-lime glass (SiO2-CaO—Na2O) or aluminosilicate glass (SiO2-Al2O—Na2O). Here, when the OLED device 100 according to the exemplary embodiment is used for lighting, the first substrate 110 may be formed from soda-lime glass. In addition, the first substrate 110 may be a substrate formed from a metal oxide or a metal nitride. The first substrate 110 according to the exemplary embodiment may be a thin glass sheet having a thickness of about 1.5 mm or less. The thin glass sheet may be manufactured through a fusion process or a floating process.

On the other hand, the second rear substrate (not shown) forming an encapsulation portion together with the first substrate 110 may be formed from a material the same as or different from a material of the first substrate 110.

The internal light extraction layer 120 is disposed on a front portion, through which light generated by the organic light-emitting layer 140 exits, and is a functional optical layer functioning to improve the light extraction efficiency of the OLED device 100. The internal extraction layer 120 according to the exemplary embodiment is disposed on the first substrate 110. In the drawing, the first substrate 110 is disposed below the internal light extraction layer 120, and the first electrode 130 is disposed above the internal extraction layer 120.

The internal extraction layer 120 according to the exemplary embodiment may include a matrix layer 121, a number of scattering particles 123, and a filling layer 126. To improve light extraction efficiency, the matrix layer 121 and the number of scattering particles 123 may be formed from materials having different refractive indices. The greater the difference between the refractive indices is, the more the light extraction efficiency is improved. Meanwhile, the matrix layer 121 may be formed from a material having a refractive index equal to, higher than, or lower than that of a material of the filling layer 126.

The matrix layer 121 may be formed from a material having a high refractive index (HRI) greater than that of the scattering materials 123. For example, the matrix layer 121 may be formed from one metal oxide or a combination of two or more metal oxides selected from a candidate group consisting of SiO2, TiO2, ZrO2, ZnO2, and SnO2.

According to the exemplary embodiment, cracks 122 may be formed in the matrix layer 121. The cracks 122 may be formed in a firing process for forming the matrix layer 121 in which the number of scattering particles 123 are dispersed, and be formed between scattering particles among the number of scattering particles 123 and between clusters of several scattering particles among the number of scattering particles 123. The cracks 122 may extend in the direction from a surface of the matrix layer 121 toward the first substrate 110. Portions or all of the cracks 122 may be formed to expose the second substrate 110 to the surface of the matrix layer 121. Like the scattering particles 123, the cracks 122 function to improve light extraction efficiency in the forward direction by further complicating or diversifying paths of light generated by the organic light-emitting layer 140. As described above, since the cracks 122 have the same scattering characteristics as the scattering particles 123, the scattering particles 123 may be reduced by an amount equal an increase in the cracks 122.

In addition, a number of irregularly shaped voids (not shown) having sizes of about 50 nm to about 900 nm may be formed in the matrix layer 121. The irregularly shaped voids (not shown) are formed in the firing process for forming the matrix layer 121 and function to scatter light generated by the organic light-emitting layer 140 along a variety of paths, like the cracks 122 and the scattering particles 123. An area occupied by the number of irregularly shaped voids (not shown) formed in the matrix layer 121 may be about 2.5% to about 10.8% with respect to the area of the matrix layer 121. The wider the area occupied by the number of irregularly shaped voids (not shown) is, the higher light extraction efficiency can be.

The number of scattering particles 123 dispersed in the matrix layer 121 may be formed from a material having a refractive index lower than that of the material of the matrix layer 121. For example, the scattering particles 123 may be formed from one metal oxide or a combination of two or more metal oxides selected from a candidate group consisting of SiO2, TiO2, ZnO2, and SnO2. At this time, when one metal oxide or a combination of two or more metal oxides selected from the candidate group is selected as a metal oxide forming the matrix layer 121, the scattering particles 123 may be formed from one metal oxide or a combination of two or more metal oxides among the remaining metal oxides of the candidate group, which has a refractive index lower than that of the metal oxide forming the matrix layer 121. The scattering particles 123 have a refractive index different from that of the matrix layer 121 and function to improve light extraction efficiency in the forward direction by further complicating or diversifying paths of light generated by the organic light-emitting layer 140. The scattering particles 123 have the shape of a nanoscale sphere. Alternatively, the scattering particles 123 may have the shape of a rod. The number of scattering particles 123 may have the same or a variety of different shapes or sizes. That is, the number of scattering particles 123 may have random sizes, distances, or shapes. When the number of scattering particles 123 are formed randomly, light extraction can be uniformly induced across a wide range of wavelength bands instead of being induced in a specific wavelength band. This feature may be more available when the OLED device 100 according to the exemplary embodiment is used for lighting.

The scattering particles 123 according to the exemplary embodiment may respectively be comprised of a core 124, a hollow portion, and a shell 125 that surrounds the core 124. Portions or all of the number of scattering particles 123 dispersed in the matrix layer 121 may have a core-shell structure. The scattering particles 123 rapidly change the difference in refractive indices between the core 124 and the shell 125 and form complicated light scattering paths, thereby further improving the light extraction efficiency of the OLED device 100.

Here, the matrix layer 121 has a very high level of surface roughness due to the number of scattering particles 123 dispersed therein, the formed cracks 122, and the irregularly shaped voids (not shown). When the matrix layer 121 in this state abuts the first electrode 130, the rough surface shape of the matrix layer 121 is directly transferred to the first electrode 130. In this case, a current may be concentrated in a sharp protrusion of the first electrode 130, thereby degrading electrical properties of the OLED device 100. To prevent this problem, the filling layer 126 is applied to the surface of the matrix layer 121 to reduce the surface roughness of the matrix layer 121. The filling layer 126 may be formed from a material having a refractive index equal to or different from that of a material of the matrix layer 121. For example, the filling layer 126 may be formed from a high-refractive-index inorganic material or a high-refractive-index hybrimer.

The filling layer 126 fills the cracks formed 122 in the matrix layer 121 to effectively prevent defects in the OLED of the OLED device 100, caused by a rapid change in the surface roughness of the matrix layer 121 in which the number of cracks 122 are formed. The shapes of the number of scattering particles 123 and the number of cracks 122 are transferred to the surface of the filling layer 126 to form surface corrugations. The surface corrugations, for example, rounded corrugations, are formed to be smoother than the corrugated structure formed on the surface of the matrix layer 121. That is, the filling layer 126 is a layer functioning to reduce the surface roughness of the matrix layer 121 and has surface roughness relatively lower than that of the matrix layer 121. The corrugations of the filling layer 126 induce a rapid change in the refractive index and provide excellent properties for scattering light generated by the organic light-emitting layer 140.

The corrugations of the filling layer 126 are transferred up to the surface of the second electrode 150. As described above, when corrugations are formed on the first electrode 130, the organic light-emitting layer 140, and the second electrode 150 sequentially stacked on the filling layer 126, due to the corrugations of the filling layer 126, a surface plasmon mode can be decreased. That is, when the surface plasmon mode is reduced by the corrugated structures of device layers, including the first electrode 130, the organic light-emitting layer 140, and the second electrode 150, together with a decrease in the waveguide mode by the refractive index change and the light scattering due to the corrugations of the filling layer 126, the light extraction efficiency of the OLED device 100 can be significantly improved.

The first electrode 130 is a transparent electrode functioning as an anode of the OLED device 100, disposed on the internal extraction layer 120. More particularly, the first electrode 130 is disposed on the filling layer 126 of the internal extraction layer 120. Due to the corrugations of the filling layer 126 transferred to the top surface and the bottom surface of the first electrode 130 (on the drawing), the first electrode 130 has a corrugated structure having a shape corresponding to the surface corrugations of the filling layer 126. The first electrode 130 may be formed from, for example, indium tin oxide (ITO) having a greater work function to facilitate a hole injection.

The organic light-emitting layer 140 is disposed on the first electrode 130. Since the first electrode 130 is imparted with the corrugated structure by the filling layer 126, the corrugated structure of the first electrode 130 is transferred to the organic light-emitting layer 140, such that the organic light-emitting layer 140 has a corrugated structure corresponding to the corrugated structure of the first electrode 130. Although not shown in detail, the organic light-emitting layer 140 may include a hole layer, an emissive layer, and an electron layer that are sequentially stacked between the first electrode 130 and the second electrode 150. Here, the hole layer may include a hole injection layer (HIL) and a hole transfer layer (HTL) that are sequentially stacked on the first electrode 130. The electron layer may include an electron transfer layer (ETL) and an electron injection layer (EIL) that are sequentially stacked on the emissive layer. When the OLED device 100 according to the exemplary embodiment is a white OLED device for lighting, the emissive layer may be formed in a multilayer structure comprised of a high molecular emissive layer emitting light in a red region and a low molecular emissive layer emitting light in an orange-red region. In addition, the emissive layer may be formed in a variety of other structures that emit white light.

According to this structure, when a forward voltage is induced between an anode, i.e. the first electrode 130, and a cathode, i.e. the second electrode 150, electrons migrate from the second electrode 150 to the emissive layer through the electron injection layer and the electron transfer layer of the electron layer, while holes migrate from the first electrode 130 to the emissive layer through the hole injection layer and the hole transfer layer of the hole layer. The electrons and the holes that have migrated into the emissive layer recombine with each other, thereby generating excitons. When these excitons transit from an excited state to a ground state, light is generated. The brightness of the generated light is proportional to the amount of current flowing between the first electrode 130 functioning as the anode and the second electrode functioning as the cathode.

According to the exemplary embodiment, the organic light-emitting layer 140 may have a tandem structure. In this case, a plurality of organic light-emitting layers 140 alternating with interconnecting layers (not shown) may be provided.

The second electrode 150 is a metal electrode functioning as the cathode of the OLED device 100 and is disposed on the organic light-emitting layer 140. The second electrode 150 may be formed from Al, Al:Li, or Mg:Ag that has a smaller work function to facilitate electron injection.

According to the exemplary embodiment, as the organic light-emitting layer 140 has the corrugated structure due to the first electrode 130 having the corrugated structure transferred from the corrugations of the filling layer 126, a corrugated structure corresponding to the corrugated structure thereof is formed on the surface of the second electrode 150. As described above, the corrugated structure formed on the surface of the second electrode 150 is defined by a plurality of convex portions 151 and a plurality of concave portions 152 formed between the adjacent convex portions 151. According to the exemplary embodiment, an aspect ratio (depth/pitch) of a pitch between the adjacent convex portions 151 and a depth of the concave portions 152 is controlled to be in the range of about 0.1 to about 7. As illustrated in SEM images of corrugated structures having various aspect ratios in FIG. 2, when the aspect ratio of the pitch between the adjacent convex portions 151 to the depth of the concave portions 152 is less than 0.1, substantially no corrugations are formed, so that the effect of reducing the surface plasmon mode is limited. In addition, when the aspect ratio of the pitch between the adjacent convex portions 151 to the depth of the concave portions 152 is greater than 7, the convex portions 151 of the corrugated structure protrude excessively to have an adverse effect on the lifespan of the OLED device 100. The pitch between the convex portions 151 may be defined as an average pitch between the plurality of convex portions 151, and an average depth of the concave portions 152 may be measured using atomic force microscopy (AFM) or confocal microscopy.

As described above, according to the present invention, to further improve the light extraction efficiency, the aspect ratio of the convex portions 151 and the concave portions 152 of the corrugated structure formed in the second electrode 150 is controlled in the above-described range, thereby realizing the corrugated structure optimized for the improvement of light extraction efficiency. As described above, when the corrugated structure formed in the second electrode 150 is optimized, it is possible to maximize the ability to reduce the waveguide mode and the surface plasmon mode that would otherwise cause a most significant loss to the efficiency of the OLED device 100, thereby significantly improving the light extraction efficiency. It is thereby possible to realize superior luminance efficiency of the OLED device 100. In addition, according to the exemplary embodiment, it is possible to modify a haze value to a range of about 5% to about 85% as required by controlling the packing density of the scattering particles 123 and the thickness of the filling layer 126.

Figure 4:
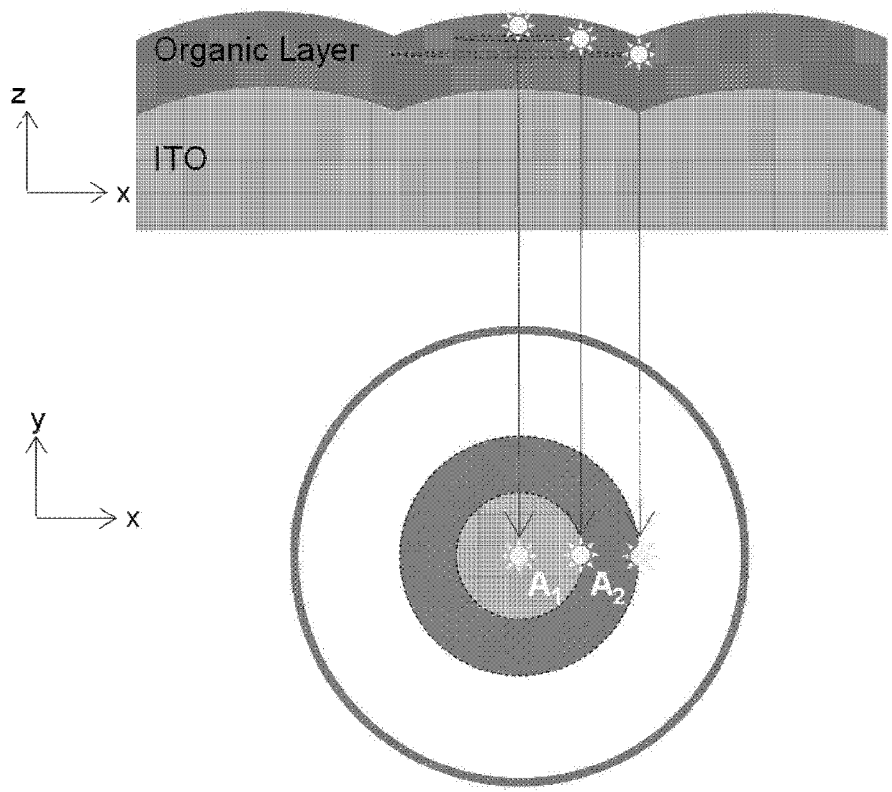
Figure 5:
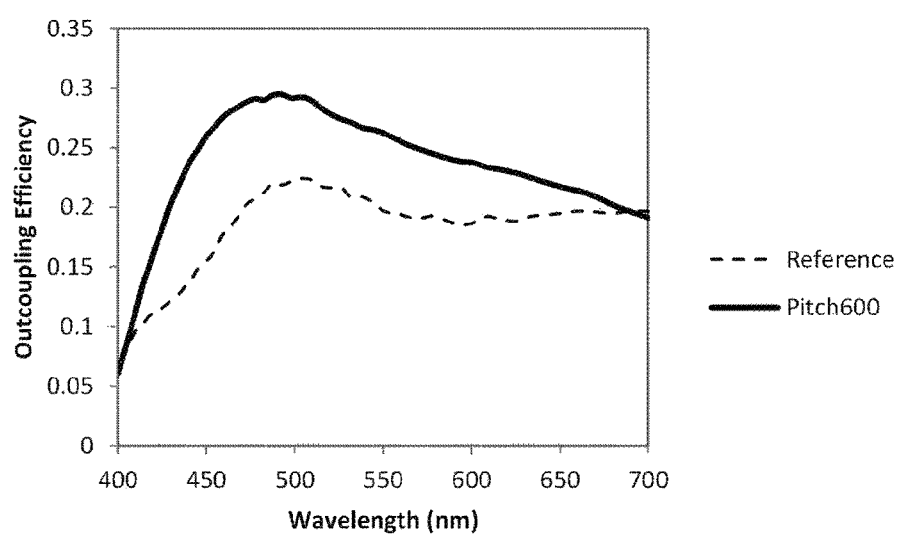
FIG. 5 is a graph illustrating a simulation result of luminance efficiency of the OLED device according to the exemplary embodiment.

In addition, FIG. 3 and FIG. 4 are reference views illustrating a simulation of the light luminance efficiency the OLED device according to the exemplary embodiment. An OLED structure, produced by coating a substrate with SiO2 having diameters of 600 nm, forming a filling layer by applying a high refractive hybrimer to the coated SiO2, and then sequentially forming an ITO electrode, an organic light-emitting layer, and an Al electrode on the filling layer, was taken as an example. Dipoles D1, D2, and D3 were assumed as emitting light in specific locations of the organic light-emitting layer. Luminance efficiency was simulated by taking the amount of emitted light according to an area as represented in Formula 1 into account. As illustrated in FIG. 5, the light extraction efficiency of the example was proved to be higher than that of an OLED device (reference) having neither an internal extraction layer nor a corrugated structure.

$$O.E = \frac{\frac{(O.E_1 + O.E_2)}{2}A_1 + \frac{O.E_2 + O.E_3}{2}A_2}{(A_1 + A_2)} \qquad \text{Formula 1}$$

The foregoing descriptions of specific exemplary embodiments of the present disclosure have been presented with respect to the drawings and are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. An organic light-emitting diode device comprising:
    a first substrate;
    an internal light extraction layer disposed on the first substrate;
    a first electrode disposed on the internal light extraction layer;
    an organic light-emitting layer disposed on the first electrode; and
    a second electrode formed on the organic light-emitting layer, wherein
    the internal light extraction layer has corrugations formed on a surface thereof,
    the second electrode has a corrugated structure on a surface thereof, due to the corrugations of the internal light extraction layer sequentially transferred to the first electrode, the light-emitting layer, and the second electrode,
    the corrugated structure has a plurality of convex portions and a plurality of concave portions alternating with the plurality of convex portions,
    an aspect ratio (depth/pitch) of a pitch between the adjacent convex portions to a depth of the concave portions ranges from 0.1 to 7, and
    the internal light extraction layer comprises:
        a matrix layer disposed on the first substrate, formed from metal oxide, and having cracks formed therein,
        a number of scattering particles dispersed in the matrix layer and formed from a material having a refractive index different from a refractive index of the metal oxide, and
        a filling layer disposed on a surface of the matrix layer to fill the cracks to reduce a surface roughness of the matrix layer, and
    the corrugations formed in a surface of the filling layer having shapes corresponding to shapes of the number of scattering particles and clusters of scattering particles among the number of scattering particles transferred thereto.

2. The organic light-emitting diode device of claim 1, wherein the cracks are formed between the number of scattering particles and between the clusters.

3. The organic light-emitting diode device of claim 2, wherein a surface roughness of the filling layer is lower than the surface roughness of the matrix layer.

4. The organic light-emitting diode device of claim 1, wherein the matrix layer is formed from one oxide or a combination of two or more oxides selected from a candidate group consisting of $SiO_2$, $TiO_2$, $ZrO_2$, $ZnO_2$, and $SnO_2$.

5. The organic light-emitting diode device of claim 4, wherein the number of scattering particles are formed from one oxide or a combination of two or more oxides selected from a candidate group consisting of $SiO_2$, $TiO_2$, $ZnO_2$, and $SnO_2$, and
    when the one oxide or the combination of two or more oxides selected from the candidate group is selected as oxide forming the matrix layer, the number of scattering particles are formed from one oxide or a combination of two or more oxides among the remaining oxides of the candidate group, a refractive index of the oxide of the number of scattering particles being lower than a refractive index of the oxide of the matrix layer.

6. The organic light-emitting diode device of claim 1, wherein at least portions of the number of scattering particles respectively have a structure comprised of a hollow core and a shell surrounding the core.

7. The organic light-emitting diode device of claim 1, wherein the internal light extraction layer further comprises a number of irregularly shaped voids disposed in the matrix layer.

8. The organic light-emitting diode device of claim 7, wherein sizes of the number of irregularly shaped voids range from 50 nm to 900 nm.

9. The organic light-emitting diode device of claim 8, wherein an area occupied by the number of irregularly shaped voids in the matrix layer is 2.5% to 10.8% of an area of the matrix layer.

10. The organic light-emitting diode device of claim 1, further comprising a second substrate disposed on the second electrode to face the first substrate to provide an encapsulation portion together with the first substrate.

* * * * *